(12) United States Patent
Chu

(10) Patent No.: US 11,183,573 B2
(45) Date of Patent: *Nov. 23, 2021

(54) III-NITRIDE FIELD-EFFECT TRANSISTOR WITH DUAL GATES

(71) Applicant: HRL Laboratories, LLC, Malibu, CA (US)

(72) Inventor: Rongming Chu, Agoura Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/870,774

(22) Filed: May 8, 2020

(65) Prior Publication Data

US 2020/0273958 A1 Aug. 27, 2020

Related U.S. Application Data

(62) Division of application No. 16/284,858, filed on Feb. 25, 2019, now Pat. No. 10,692,984, which is a (Continued)

(51) Int. Cl.
*H01L 29/423* (2006.01)
*H01L 29/78* (2006.01)
(Continued)

(52) U.S. Cl.
CPC ...... *H01L 29/4236* (2013.01); *H01L 29/2003* (2013.01); *H01L 29/402* (2013.01);
(Continued)

(58) Field of Classification Search
CPC combination set(s) only.
See application file for complete search history.

(56) References Cited

U.S. PATENT DOCUMENTS 10,276,712 B2 * 4/2019 Chu .................... H01L 29/4236
2013/0037868 A1 2/2013 Okamoto et al.
(Continued)

OTHER PUBLICATIONS

Communication pursuant to Article 94(3) EPC from EP app. No. 16866855.6, dated Jun. 23, 2021.
(Continued)

*Primary Examiner* — Robert G Bachner
(74) *Attorney, Agent, or Firm* — Ladas & Parry

(57) ABSTRACT

A field effect transistor (FET) includes a III-nitride channel layer, a III-nitride barrier layer on the channel layer, a first dielectric on the barrier layer, a first gate trench extending through the first dielectric, and partially or entirely through the barrier layer, a second dielectric on a bottom and walls of the first gate trench, a source electrode on a first side of the first gate trench, a drain electrode on a second side of the first gate trench opposite the first side, a first gate electrode on the second dielectric and filling the first gate trench, a third dielectric between the first gate trench and the drain electrode, a second gate trench extending through the third dielectric and laterally located between the first gate trench and the drain electrode, and a second gate electrode filling the second gate trench.

8 Claims, 9 Drawing Sheets

Related U.S. Application Data division of application No. 15/345,406, filed on Nov. 7, 2016, now Pat. No. 10,276,712.

(60) Provisional application No. 62/257,328, filed on Nov. 19, 2015.

(51) Int. Cl.
*H01L 29/20* (2006.01)
*H01L 29/40* (2006.01)
*H01L 29/778* (2006.01)
*H01L 29/51* (2006.01)

(52) U.S. Cl.
CPC ...... *H01L 29/7786* (2013.01); *H01L 29/7831* (2013.01); *H01L 29/518* (2013.01)

(56) References Cited

U.S. PATENT DOCUMENTS

| | | |
|---|---|---|
| 2014/0264431 A1 | 9/2014 | Lal |
| 2015/0243657 A1 | 8/2015 | Lin et al. |

OTHER PUBLICATIONS

Extended European Search Report from EP app. No. 16866855.6, dated Aug. 9, 2019.

\* cited by examiner

III-NITRIDE FIELD-EFFECT TRANSISTOR WITH DUAL GATES

CROSS-REFERENCE TO RELATED APPLICATIONS

This application is a divisional application of U.S. patent application Ser. No. 16/284,858, filed Feb. 25, 2019, which is a divisional application of U.S. patent application Ser. No. 15/345,406, filed on Nov. 7, 2016, which is incorporated herein by reference as though set forth in full. This application relates to U.S. Pat. No. 8,530,978, issued Sep. 10, 2013, U.S. Pat. No. 8,853,709, issued Oct. 7, 2014, U.S. Pat. No. 8,941,118, issued Jan. 27, 2015, and U.S. patent application Ser. No. 14/290,029, filed May 29, 2014, and relates to and claims the benefit of priority from U.S. Provisional Patent Application 62/257,328, filed Nov. 19, 2015, which are incorporated herein by reference as though set forth in full.

STATEMENT REGARDING FEDERAL FUNDING

None.

TECHNICAL FIELD

This disclosure relates to field effect transistors (FETs).

BACKGROUND

Field effect transistors generally have a source electrode, a drain electrode and a gate electrode, which controls the current between the source electrode and the drain electrode. A reduced electric field on the current controlling gate electrode is desirable to make the threshold voltage more stable and to improve the reliability of the gate structure. In the prior art, field-plates have been used for this purpose.

U.S. Pat. No. 8,530,978, issued Sep. 10, 2013, U.S. Pat. No. 8,853,709, issued Oct. 7, 2014, U.S. Pat. No. 8,941,118, issued Jan. 27, 2015, and U.S. patent application Ser. No. 14/290,029, filed May 29, 2014, which are incorporated herein by reference, describe field effect transistors, which are GaN FETs that have normally-off operation, high voltage operation, low on-resistance, and desirable dynamic characteristics. However, the prior art normally-off GaN transistor gate structures often experience a drift of threshold voltage under large drain bias.

FIGS. 1A, 1B and 1C show an example of threshold voltage drift for a prior art FET with field plates. FIG. 1A shows the FET threshold voltage before stress, which shows the threshold voltage to be approximately Vg=0 volts. FIG. 1B shows a high 300 volt stress applied to the drain for 150 hours. FIG. 1C shows that after the high voltage stress, the threshold voltage shifted by 0.5 volts to approximately Vg=−0.5 volts. The threshold voltage shift is undesirable.

What is needed are more reliable normally-off high-voltage III-Nitride power transistors, which have reduced or no threshold voltage drift under a large drain bias. The embodiments of the present disclosure answer these and other needs.

SUMMARY

In a first embodiment disclosed herein, a field effect transistor (FET) comprises a III-nitride channel layer, a III-nitride barrier layer on the channel layer, a first dielectric on the barrier layer, a first gate trench extending through the first dielectric, and partially or entirely through the barrier layer, a second dielectric on a bottom and walls of the first gate trench, a source electrode having electrical contact to the channel layer on a first side of the first gate trench, a drain electrode having electrical contact to the channel layer on a second side of the first gate trench opposite the first side, a first gate electrode on the second dielectric and filling the first gate trench, a third dielectric between the first gate trench and the drain electrode, a second gate trench extending through the third dielectric and laterally located between the first gate trench and the drain electrode, and a second gate electrode filling the second gate trench.

In another embodiment disclosed herein, a method of fabricating a field effect transistor comprises forming a III-nitride channel layer, forming a III-nitride barrier layer on top of the channel layer, forming a first dielectric on top of the barrier layer, forming a first gate trench through the first dielectric and partially or entirely through the barrier layer, forming a second dielectric on a bottom and walls of the first gate trench, forming a source electrode having electrical contact to the channel layer on a first side of the first gate trench, forming a drain electrode having electrical contact to the channel layer on a second side of the first gate trench opposite the first side, forming a first gate electrode on the second dielectric and filling the first gate trench, forming a third dielectric between the first gate trench and the drain electrode, forming a second gate trench extending through the third dielectric and laterally located between the first gate trench and the drain electrode, and forming a second gate electrode filling the second gate trench.

In yet another embodiment disclosed herein, a field-effect transistor comprises a III-nitride channel layer, a III-nitride barrier layer on the channel layer, a first dielectric on the barrier layer, a source electrode disposed on a first end of the field effect transistor, a drain electrode disposed on a second end of the field effect transistor opposite the first end, a first gate structure disposed between the source electrode and the drain electrode, and a second gate structure disposed between the first gate structure and the drain electrode.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Figure 1A:
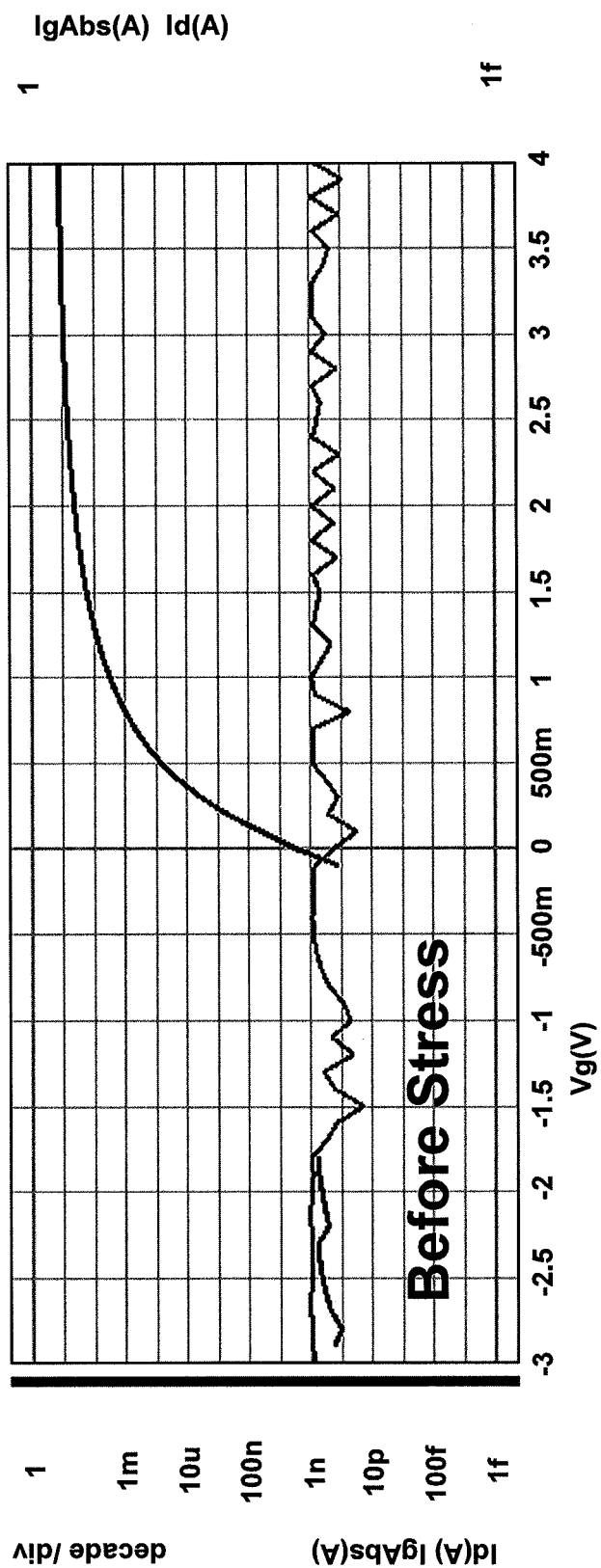
FIG. 1A shows an example prior art FET threshold voltage before stress.
Figure 1B:
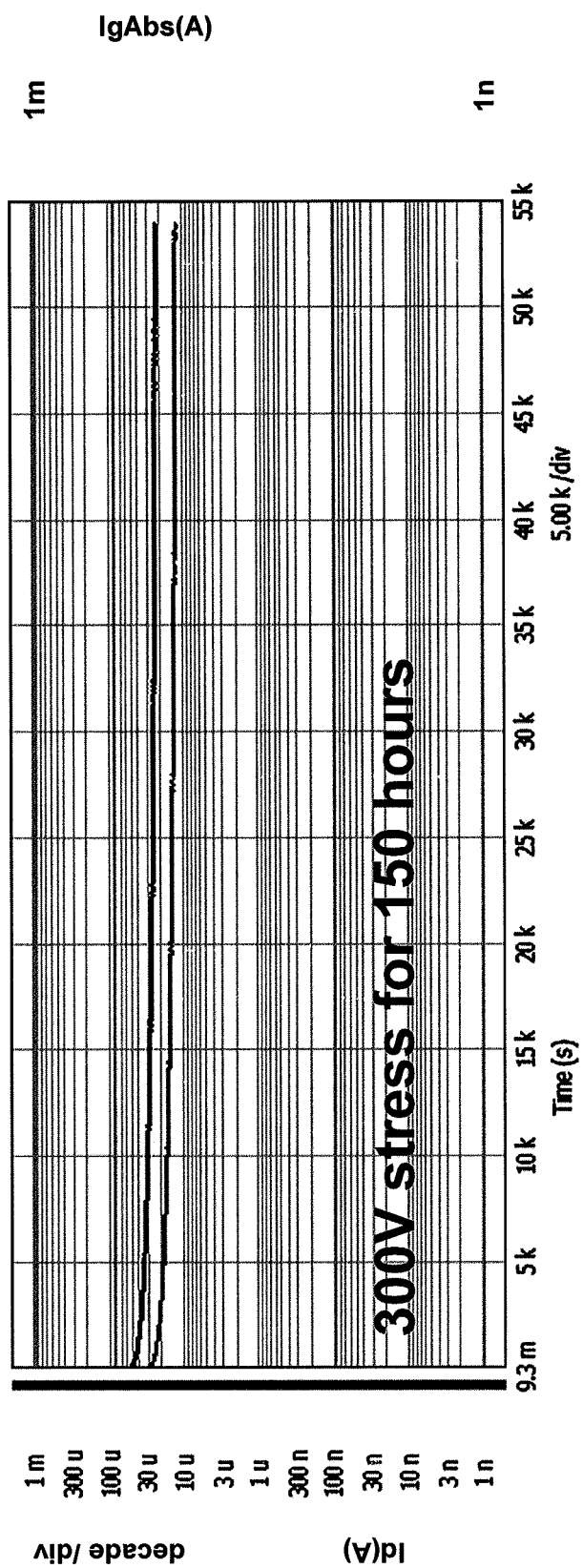
FIG. 1B shows a high 300 volt stress applied to the drain for 150 hours.
Figure 1C:
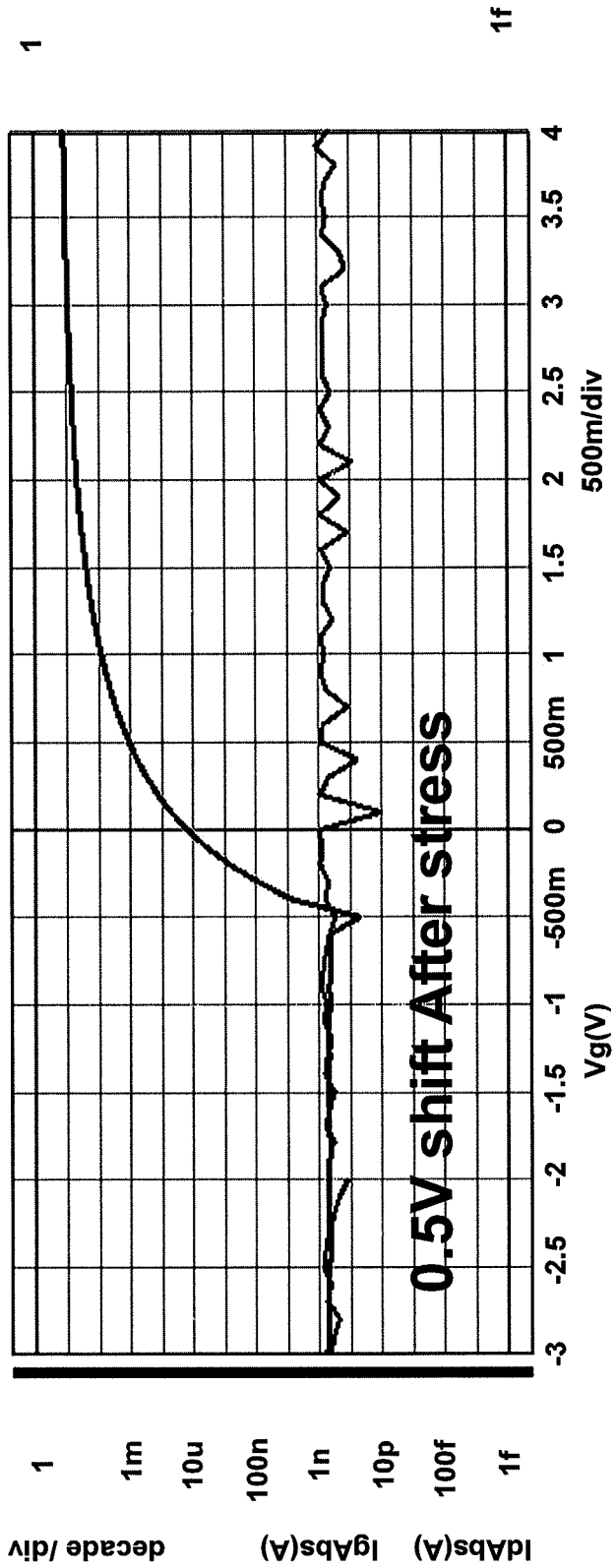
FIG. 1C shows the prior art FET threshold voltage after the high voltage stress which shows a 0.5 volt drift in the threshold voltage caused by the high voltage stress for a prior art FET with field plates.
Figure 2:
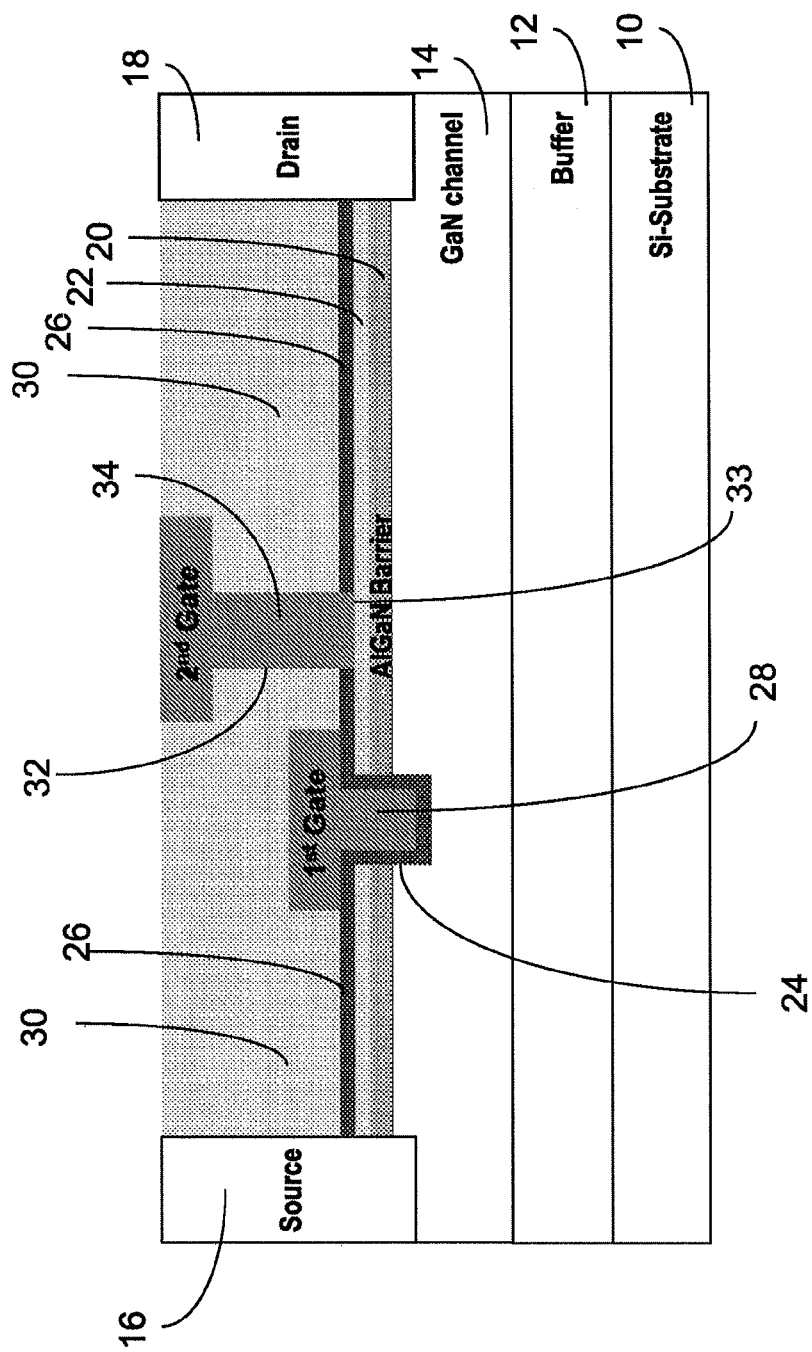
FIG. 2 shows an elevation sectional view of a dual gate III-nitride field effect transistor in accordance with the present disclosure.

FIG. 2 shows an elevation sectional view of a dual gate III-nitride field effect transistor in accordance with the present disclosure.

The substrate 10 may be Si, Sapphire, SiC, GaN or AlN. A III-nitride buffer layer 12 is on the substrate 10. A III-nitride channel layer 14, which may be any III-nitride and preferably GaN, is on top of the buffer layer 12. A source electrode 16 is in electrical contact with the channel layer 14 on one side of the channel layer 14, and a drain electrode 18 is in electrical contact with the channel layer 14 on another side of the channel layer 14. A III-nitride barrier layer 20 with a bandgap greater than the channel layer 14, is on top of the channel layer 14. The III-nitride barrier layer may preferably be 1 nanometer (nm) to 20 nm thick AlGaN. A first dielectric 22, which may typically be 1 nm to 100 nm thick SiN, is on top of the barrier layer 20.

A first gate trench 24 extends through the first dielectric 22 and partially through the barrier layer 24, or extends through the first dielectric 22 and entirely through the barrier layer 24 to the channel layer 14. A second dielectric 26, which may typically be AlN-based, is on the walls and the bottom of the first gate trench 24. The second dielectric may also be over the first dielectric 22.

A metallic first gate electrode 28 is on the second dielectric 26 and fills the first gate trench 24 and may extend partially over the second dielectric 26 on either side of the first gate trench 24. A third dielectric 30, which may typically be SiN having a thickness ranging from 0.1 nm to 10 μm, may cover the first gate electrode 28 and extend between the source electrode 16 and the drain electrode 18, or at least cover the first gate electrode 28 and extend between the first gate electrode 28 and the drain electrode 18. The third dielectric 30 may be on the second dielectric 26.

The first gate trench 24, the second dielectric 26, and the metallic first gate electrode 28 collectively form a first gate structure.

A second gate trench 32 is located between the first gate electrode 28 and the drain electrode 18. The second gate trench 32 extends through the third dielectric 30 and the bottom 33 of the second gate trench 32 may be located between the top surface of the barrier layer 20 and a top surface of the second dielectric 26. In one embodiment, shown in FIG. 2, the bottom 33 of the second gate trench 32 is on the top surface of the first dielectric 22. A metallic second gate electrode 34 fills the second gate trench 32. In the embodiment, shown in FIG. 2, because the first dielectric 22 is 1 nm to 100 nm thick, the distance between the bottom 33 of the second gate electrode 34 and a top surface of the barrier layer 20 is 1 nm to 100 nm.

The second gate trench 32 and the metallic first gate electrode 34 collectively form a second gate structure.

In the embodiment shown in FIG. 2 the second gate electrode 34 is not electrically connected to the source electrode 16.

Figure 3:
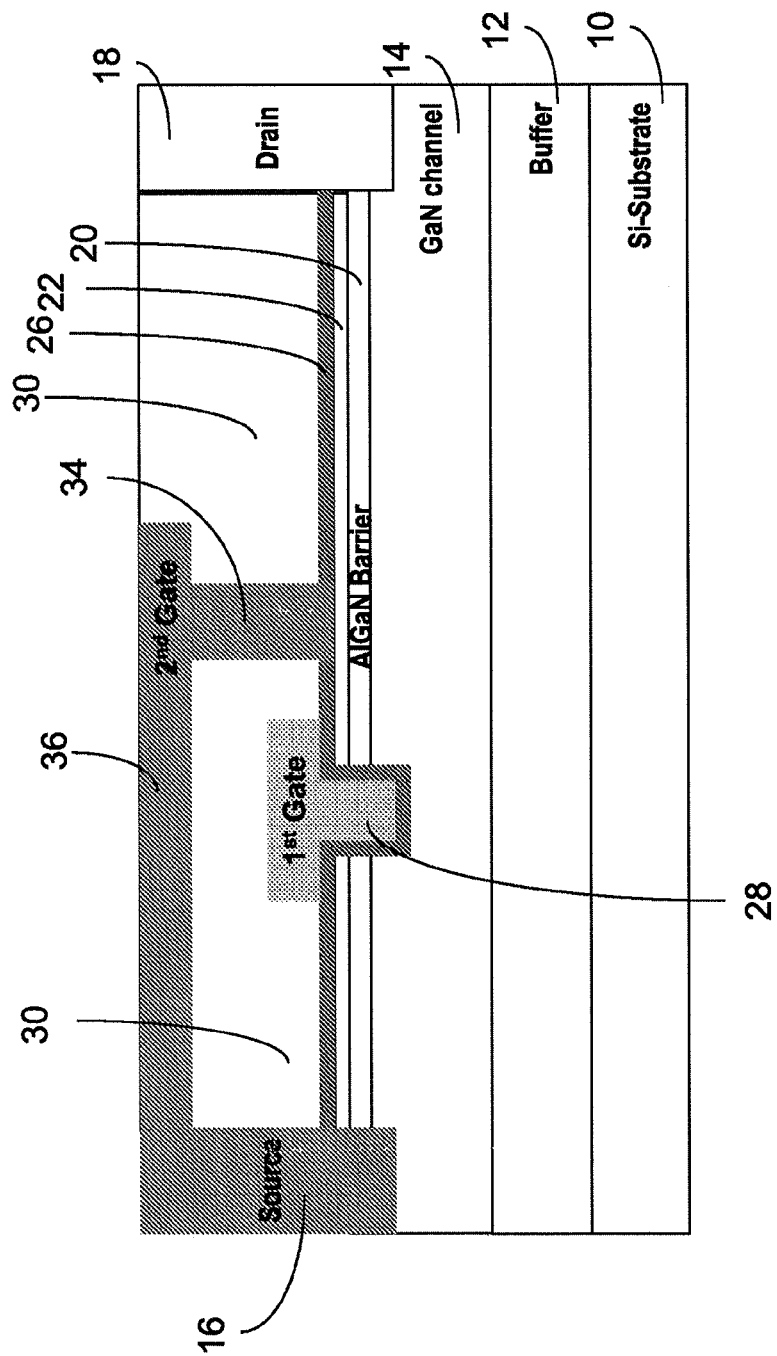
FIG. 3 shows an elevation sectional view of another dual gate III-nitride field effect transistor in accordance with the present disclosure.

FIG. 3 shows an elevation sectional view of another dual gate III-nitride field effect transistor in accordance with the present disclosure. In this embodiment the second gate electrode 34 is electrically connected to the source electrode 16 by metal 36. The metal 36 is insulated from the first gate electrode 28 by third dielectric 30, which is between the metal 36 and the first gate electrode 28.

Figure 4:
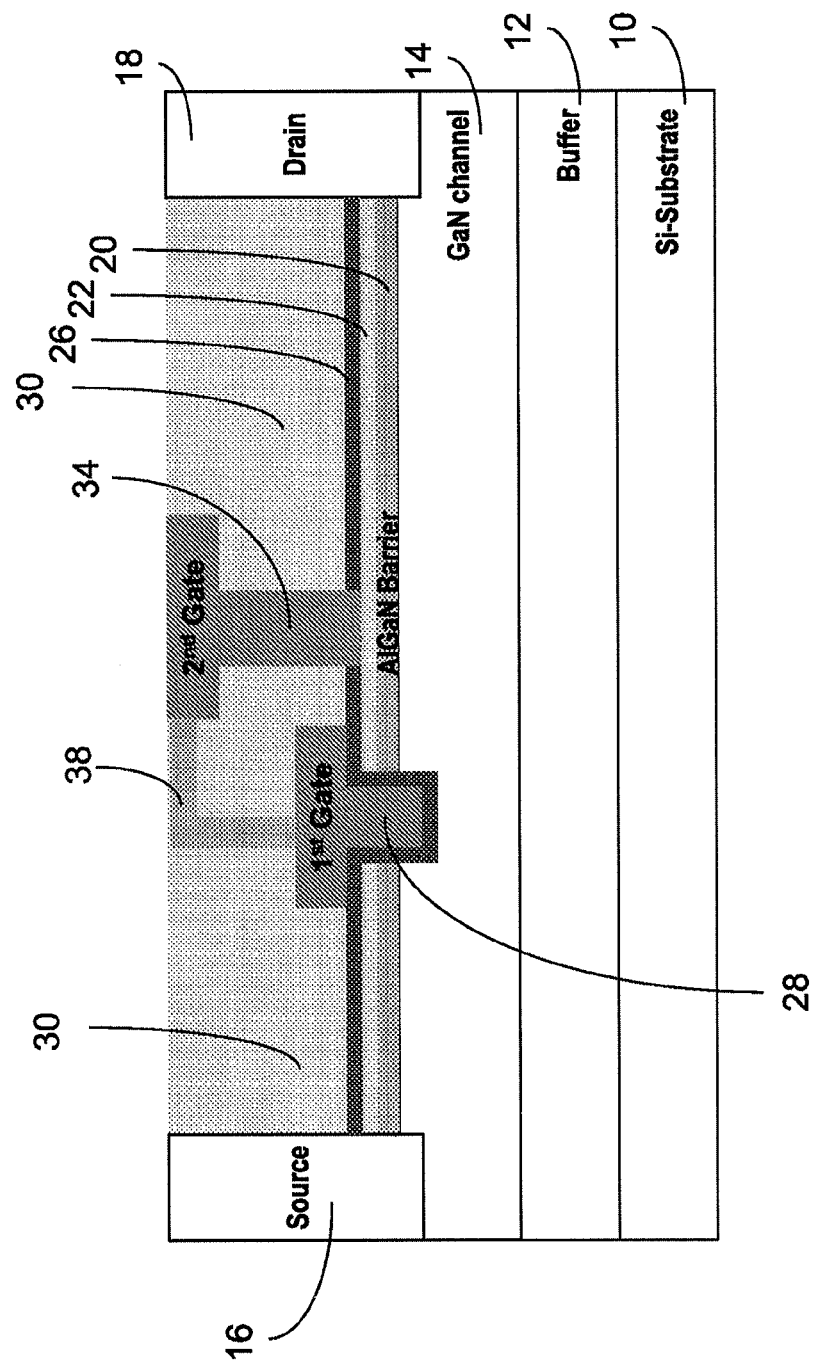
FIG. 4 shows an elevation sectional view of yet another dual gate III-nitride field effect transistor in accordance with the present disclosure.

FIG. 4 shows an elevation sectional view of yet another dual gate III-nitride field effect transistor in accordance with the present disclosure. In this embodiment the second gate electrode 34 is electrically connected to the first gate electrode 28 by metal 38. FIG. 4 shows one embodiment of the metal 38. A person skilled in the art would understand that the metal 38 between the second gate electrode 34 and the first gate electrode 28 may have various geometries.

In the embodiment shown in FIG. 2, the second gate electrode 34 may be biased independently of the first gate electrode 28.

The first gate electrode 28 is a normally-off gate while the second gate electrode 34 is a normally-on gate. Therefore, without external biases applied to the either the first gate electrode 28 or the second gate electrode 34, there are no mobile electrons under the first gate electrode 28, however, there are mobile electrons under the second gate electrode 34.

The threshold voltage of the second gate electrode 34 may range from 0 Volts (V) to −50V. The threshold voltage is determined by the electron density in the channel, the vertical distance between the channel and the bottom of the gate electrode, as well as the dielectric constant of the layers between the channel and the bottom of the gate electrode. One can easily adjust the threshold voltage of the second electrode, for example, by varying the thickness of the 1st dielectric, or by varying the etch depth of the 2nd gate trench.

The first gate electrode 28 is a normally-off gate controlling the current through the channel 14. The second gate electrode 34 is a normally-on gate shielding the first gate electrode 28 from being affected by large drain voltage biases. As described above, the second gate electrode 34 may be independently biased, electrically connected to the source electrode 16, or connected to the first gate electrode 28. A preferred embodiment is to connect the second gate electrode 34 to the source electrode 16, acting as a source-connected field-plate, as shown in FIG. 3.

Without the second gate electrode 34, there is a large voltage drop between the first gate electrode 28 and the drain electrode 18 when the transistor is at off-state blocking high voltages. The large voltage drop results in high electric-field across the first gate electrode 28. The high electric-field accelerates the change of charge states of the traps under the first gate electrode 28, leading to shift of threshold voltage. Threshold voltage shift negatively affects device stability.

For a FET in accordance with the present disclosure, the second gate electrode 34 electrically shields the first gate electrode 28 from drain electrode 18 biases as soon as the channel electrons under the second gate electrode 34 are depleted. The maximum voltage drop applied to the first gate electrode 28 will be no more than the threshold voltage of the second gate electrode 34. Therefore, we can design the second gate electrode 34 to make sure voltage drop across the first gate electrode 28 is small enough for stable operation.

Although the second gate electrode 34 is now exposed to large voltage drop induced by drain bias, a moderate shift of the threshold voltage of the second gate electrode 34 is less critical to device operation, because the first gate electrode 28, which is closer to the source, controls the channel current.

The following describes the fabrication process for making a FET according to the present disclosure.

The III-nitride buffer layer 12 is grown on top of the substrate 10, which may be Si, Sapphire, SiC, GaN or AlN. Then the III-nitride channel layer 14, which may be any II=nitride and preferably GaN, is grown on top of the buffer layer 12. Next, the III-nitride barrier layer 20 with a bandgap greater than the channel layer 14 is grown on top of the channel layer 14. The III-nitride barrier layer 20 may preferably be 1 nanometer (nm) to 20 nm thick AlGaN. Then, the first dielectric 22, which may typically be 1 nm to 100 nm thick SiN, is deposited on top of the barrier layer 20.

The first gate trench 24 is then formed through the first dielectric 22 and partially or entirely through the barrier layer 20 to remove channel electrons under the first gate electrode 28 induced by the barrier layer 20. Next, the second dielectric 26, which may typically be AlN-based is deposited to line the first gate trench 24. The second dielectric may also extend between the first gate trench 24 and the source dielectric 16 and between the first gate trench 24 and the drain dielectric 18

The source electrode 16 and the drain electrode 18 are then formed on the two opposite sides of the first gate trench 24. The source electrode 16 and the drain electrode 18 are in electrical contact with the channel 14.

The first gate electrode 28 of metal is then formed on the second dielectric 26, filling the first gate trench 24. Next, the third dielectric 30, which may be typically 0.1 nm to 10 μm thick SiN is deposited covering at least the portion between the first gate electrode 28 and the drain electrode 18, and in some embodiments, such as FIG. 3, covering also between the first gate electrode 28 and the source electrode 16.

Then, the second gate trench 32 is formed through the third dielectric 30 and located between the first gate electrode 28 and the drain electrode 18. Next, the second gate electrode 34 of metal formed in the second gate trench 32. The second gate trench 32 extends through the third dielectric 30 and the bottom 33 of the second gate trench 32 may be located between the top surface of the barrier layer 20 and a top surface of the second dielectric 26. In one embodiment, shown in FIG. 2, the bottom 33 of the second gate trench 32 is on the top surface of the first dielectric 22. The metallic second gate electrode 34 fills the second gate trench 32. In the embodiment, shown in FIG. 2, because the first dielectric 22 is 1 nm to 100 nm thick, the distance between the bottom 33 of the second gate electrode 34 and a top surface of the barrier layer 20 may range from 1 nm to 100 nm.

For the embodiment of FIG. 3, the metal 36 is then deposited on the third dielectric 30 to electrically connect the second gate electrode 34 to the source electrode 16. For this embodiment the third dielectric 30 insulates the first gate electrode 28 from the second gate electrode 34.

For the embodiment of FIG. 4, the metal 38 is then deposited to electrically connect the second gate electrode 34 to the first gate electrode 28. This may include patterning and depositing steps well known in the art.

Figure 5A:
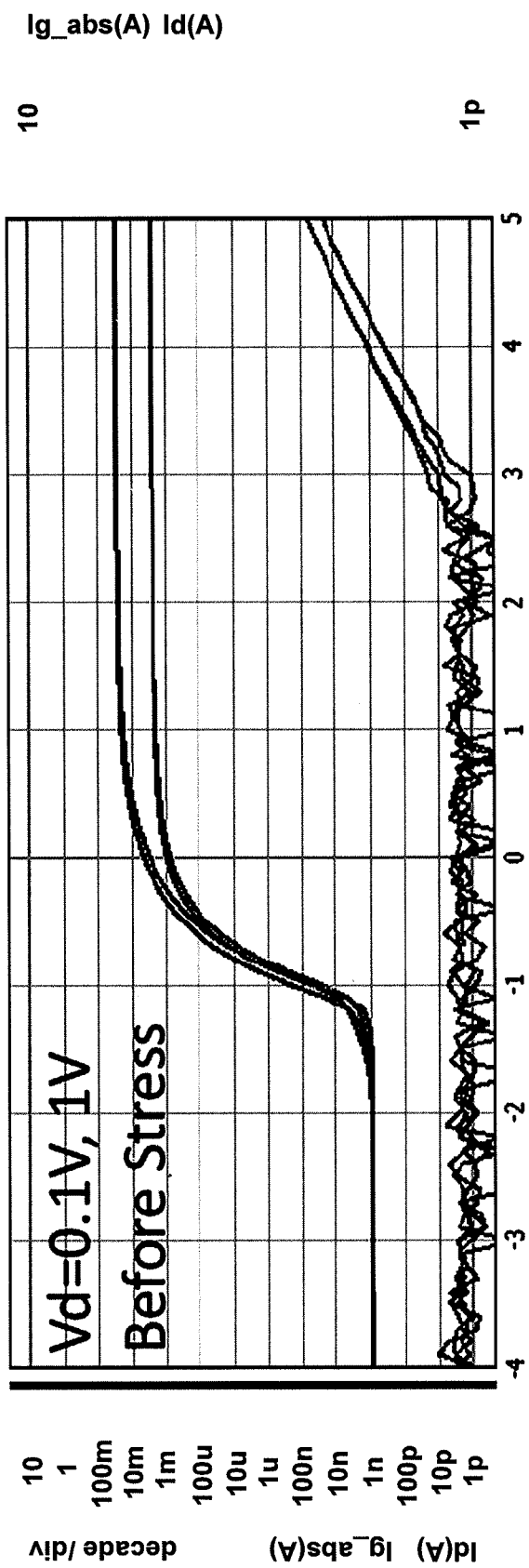
FIG. 5A shows a FET threshold voltage before stress.
Figure 5B:
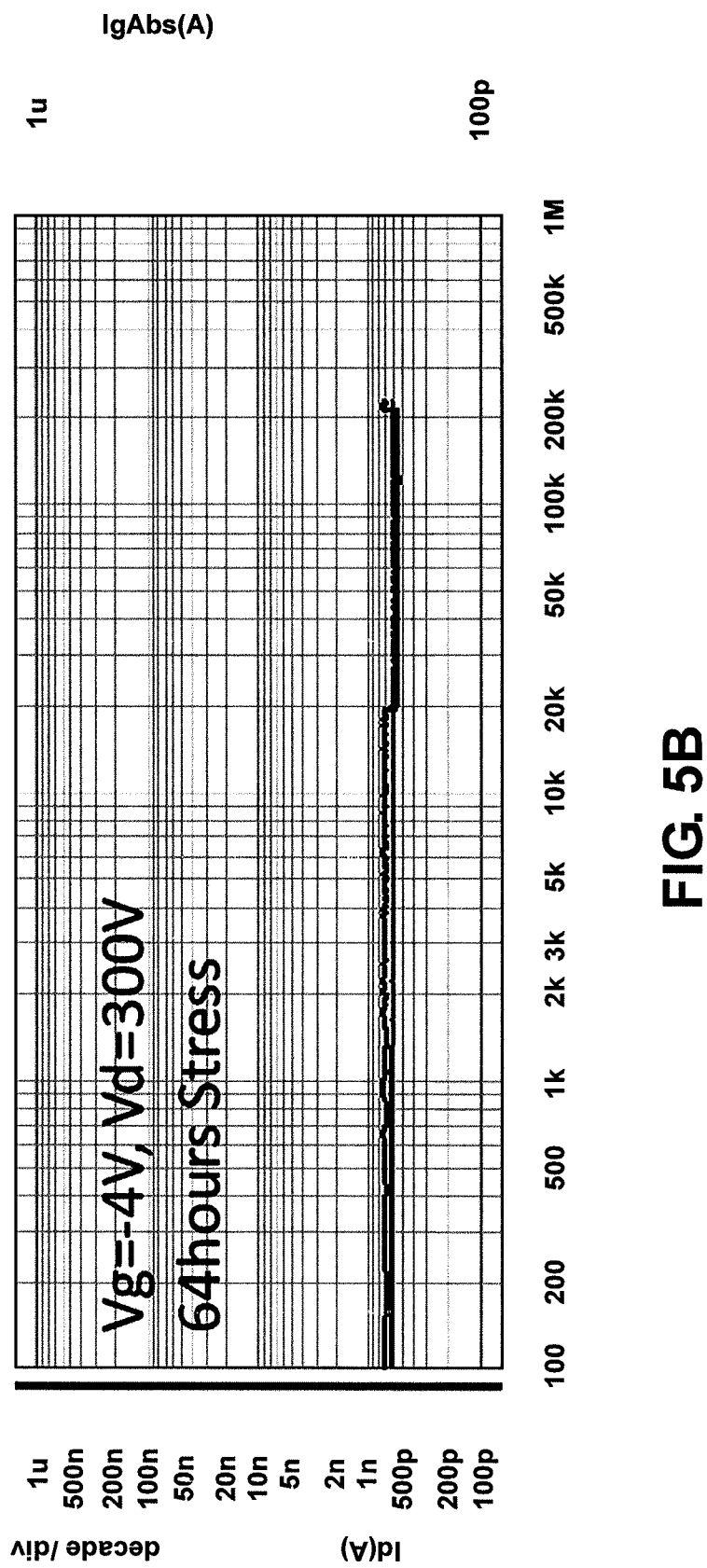
FIG. 5B shows a high 300 volt stress applied to the drain for 64 hours.
Figure 5C:
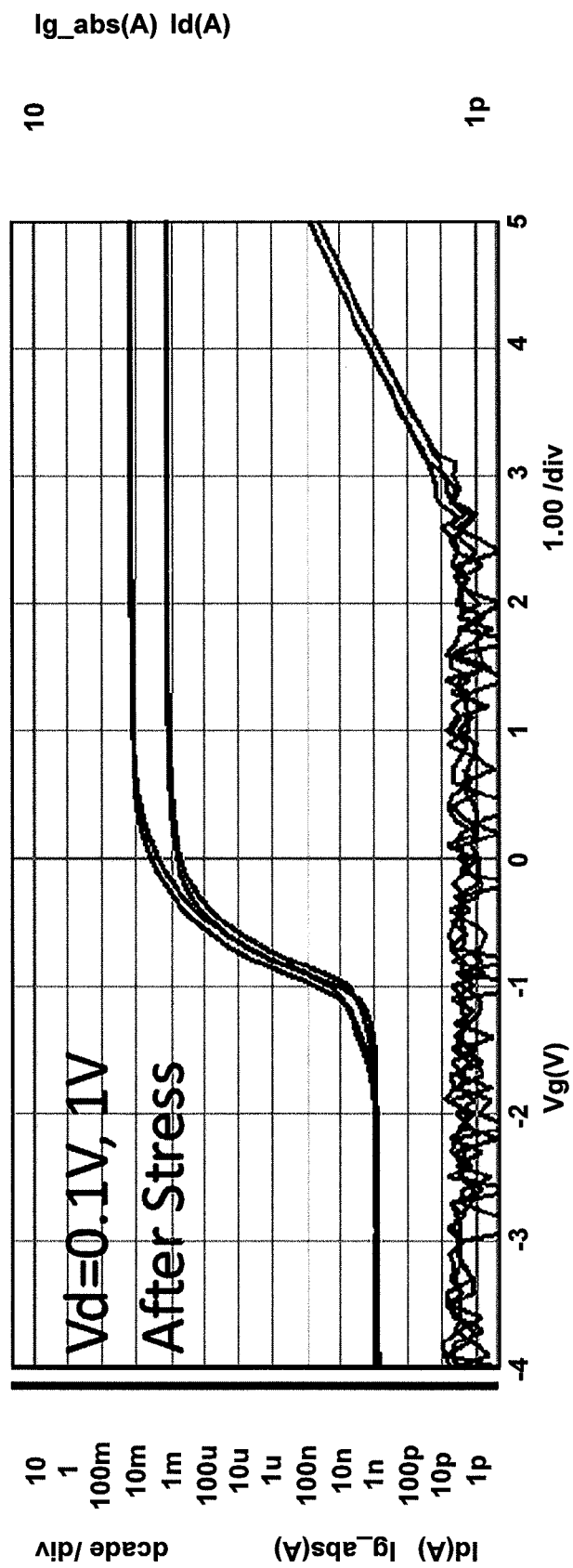
FIG. 5C shows the FET threshold voltage after the high voltage stress which shows no volt drift in the threshold voltage caused by the high voltage stress for a FET in accordance with the present disclosure.

FIGS. 5A, 5B and 5C show an example of threshold voltage drift for a FET with dual gates in accordance with the present disclosure. FIG. 5A shows the FET threshold voltage before stress, FIG. 5B shows a high 300 volt stress applied to the drain for 64 hours, and FIG. 5C shows that after the high voltage stress, the FET threshold voltage is the same as before the high voltage stress, which is the desired result.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A field-effect transistor comprising:
   a Ill-nitride channel layer;
   a Ill-nitride barrier layer on the channel layer;
   a first dielectric on the barrier layer;
   a first gate trench extending through the first dielectric, and partially or entirely through the barrier layer;
   a second dielectric on a bottom and walls of the first gate trench;
   a source electrode having electrical contact to the channel layer on a first side of the first gate trench;
   a drain electrode having electrical contact to the channel layer on a second side of the first gate trench opposite the first side;
   a first gate electrode on the second dielectric and filling the first gate trench;
   a third dielectric between the first gate trench and the drain electrode, wherein the first gate is a normally-off gate;
   a second gate trench extending through the third dielectric and laterally located between the first gate trench and the drain electrode; and
   a second gate electrode filling the second gate trench, wherein the second gate is a normally-on gate.

2. The field-effect transistor of claim 1 wherein a vertical distance between a bottom of the second gate electrode and a top surface of the barrier layer has a range of 1 nm to 100 nm.

3. The field-effect transistor of claim 1 wherein:
the second dielectric extends between the first gate trench and the drain electrode and is on the first dielectric; the third dielectric is on the second dielectric; and a bottom of the second gate electrode is between a top surface of the barrier layer and a top surface of the second dielectric.

4. The field-effect transistor of claim 1 wherein the second dielectric is AlN-based.

5. The field-effect transistor of claim 1 wherein the third dielectric comprises SiN having a thickness of 0.1 nm to 10 µm.

6. The field-effect transistor of claim 1 further comprising:
an electrical connection between the second gate electrode and the source electrode; or
an electrical connection between the second gate electrode and the first gate electrode.

7. The field-effect transistor of claim 1 further comprising:
a substrate comprising Si, Sapphire, SiC, GaN or AlN; and a III-nitride buffer layer coupled between the substrate and the channel layer.

8. The field-effect transistor of claim 1 wherein the III-nitride barrier layer comprises AlGaN having a thickness of 1 nanometer (nm) to 20 nm.

* * * * *